United States Patent
Kimura et al.

(10) Patent No.: US 9,951,671 B2
(45) Date of Patent: Apr. 24, 2018

(54) HEAT TRANSFER DEVICE, TEMPERATURE CONTROLLER, INTERNAL COMBUSTION ENGINE, EXHAUST SYSTEM THEREOF, AND MELTING FURNACE

(71) Applicant: DENSO CORPORATION, Kariya, Aichi-pref. (JP)

(72) Inventors: Yuji Kimura, Nagoya (JP); Mitsuhiro Kataoka, Kasugai (JP); Susumu Sobue, Obu (JP)

(73) Assignee: DENSO CORPORATION, Kariya (JP)

( * ) Notice: Subject to any disclaimer, the term of this patent is extended or adjusted under 35 U.S.C. 154(b) by 345 days.

(21) Appl. No.: 14/798,566

(22) Filed: Jul. 14, 2015

(65) Prior Publication Data

US 2016/0017786 A1 Jan. 21, 2016

(30) Foreign Application Priority Data

Jul. 18, 2014 (JP) ................................. 2014-148157

(51) Int. Cl.
*H02N 3/00* (2006.01)
*H01L 37/00* (2006.01)
*F01N 5/02* (2006.01)
*H01L 35/30* (2006.01)

(52) U.S. Cl.
CPC .............. *F01N 5/025* (2013.01); *H01L 35/30* (2013.01); *H01L 37/00* (2013.01); *H02N 3/00* (2013.01)

(58) Field of Classification Search
CPC ............ H02N 3/00; H02N 10/00; H01J 45/00
USPC ........................................................ 310/306
See application file for complete search history.

(56) References Cited

U.S. PATENT DOCUMENTS 3,648,152 A * 3/1972 Low ........................ G21H 1/103
                                                                 310/300
4,280,074 A * 7/1981 Bell ........................ H02N 3/00
                                                                 136/206
4,281,280 A * 7/1981 Richards .................. H02N 3/00
                                                                 310/306

(Continued)

FOREIGN PATENT DOCUMENTS

JP     2004-150741 A     5/2004
JP     2004-349398 A    12/2004

(Continued)

OTHER PUBLICATIONS

G. D. Mahan, Thermionic refrigeration, Journal of Applied Physics, Oct. 1, 1994, 4362-4366, vol. 76, Issue No. 7, American Institute of Physics, U.S.A.

*Primary Examiner* — Burton Mullins
(74) *Attorney, Agent, or Firm* — Posz Law Group, PLC (57) ABSTRACT

A heat transfer device that includes a thermionic power generator, a wiring, a load circuit, and a switch circuit. The thermionic power generator includes an emitter electrode and a collector electrode facing each other with an inter-electrode gap distance, and converts heat energy into electric energy by capturing, with the collector electrode, a thermo-electron that is emitted from the emitter electrode. The wiring electrically connects the emitter electrode and the collector electrode. The load circuit is connected to an electric current path of by wiring between the emitter electrode and the collector electrode. The switch circuit switches between an ON state and an OFF state.

10 Claims, 6 Drawing Sheets

(56) References Cited

U.S. PATENT DOCUMENTS

| | | | | |
|---|---|---|---|---|
| 4,368,416 A | * | 1/1983 | James | H01J 45/00 136/205 |
| 5,770,911 A | * | 6/1998 | Cheng | H01L 35/00 136/205 |
| 5,945,767 A | * | 8/1999 | Westlund | H02N 10/00 136/201 |
| 6,064,137 A | * | 5/2000 | Cox | H01J 45/00 310/306 |
| 6,232,543 B1 | * | 5/2001 | Nagata | G04C 10/00 136/203 |
| 6,949,873 B2 | * | 9/2005 | Sung | H01J 1/304 313/309 |
| 7,109,408 B2 | * | 9/2006 | Kucherov | H01L 29/08 136/201 |
| 7,169,006 B2 | * | 1/2007 | Tavkhelidze | H01J 45/00 257/E23.181 |
| 2003/0223919 A1 | * | 12/2003 | Kwak | B01D 53/9445 422/174 |
| 2004/0261831 A1 | | 12/2004 | Tsuneoka et al. | |
| 2011/0139205 A1 | * | 6/2011 | Kimura | H01J 45/00 136/205 |

FOREIGN PATENT DOCUMENTS

| | | |
|---|---|---|
| JP | 2007-201130 A | 8/2007 |
| JP | 2014-001654 A | 1/2014 |

* cited by examiner

FIG. 6 ic power generator, as well as a temperature controller, an internal combustion engine, an exhaust system thereof, and a heat furnace all having the thermionic power generator.

HEAT TRANSFER DEVICE, TEMPERATURE CONTROLLER, INTERNAL COMBUSTION ENGINE, EXHAUST SYSTEM THEREOF, AND MELTING FURNACE

CROSS REFERENCE TO RELATED APPLICATION

The present application is based on and claims the benefit of priority of Japanese Patent Application No. 2014-148157, filed on Jul. 18, 2014, the disclosure of which is incorporated herein by reference.

TECHNICAL FIELD

The present disclosure generally relates to a heat transfer device having a thermionic power generator, as well as a temperature controller, an internal combustion engine, an exhaust system thereof, and a heat furnace all having the thermionic power generator.

BACKGROUND INFORMATION

The thermionic power generator which transforms thermal energy into the electrical energy is known by capturing the thermoelectron emitted from an emitter electrode by the collector electrode (see the patent document 1 listed below).

(Patent document 1) JP 2004-349398 A

However, since the amount of the thermoelectron emitted from an emitter electrode is dependent on the temperature of the heat source which touches an emitter electrode, the temperature of this heat source is uncontrollable by a thermionic power generator given in the above-mentioned patent document 1.

SUMMARY

It is an object of the present disclosure to provide a technique that enables a temperature control of a heat source by using a thermionic power generator.

In an aspect of the present disclosure, a heat transfer device includes a thermionic power generator, a wiring, a load circuit, and a switch circuit. The thermionic power generator includes an emitter electrode and a collector electrode facing each other with an inter-electrode gap distance, and converts heat energy into electric energy by capturing, with the collector electrode, a thermoelectron that is emitted from the emitter electrode. The wiring electrically connects the emitter electrode and the collector electrode. The load circuit is connected to an electric current path of by wiring between the emitter electrode and the collector electrode. The switch circuit switches between an ON state and an OFF state.

When the switching circuit is switched to an OFF state, the heat transfer device of the present disclosure having the above configuration can reduce/restrict the movement of the thermoelectron from the emitter electrode to the collector electrode, and can realize vacuum insulation according to a degree of vacuum of space which separates the emitter electrode and the collector electrode. Thereby, the heat transfer device of the present disclosure can maintain warmth of a heat source from which the heat transfer device transfers heat.

On the other hand, the heat transfer device of the present disclosure can move the thermoelectron from the emitter electrode to the collector electrode by an amount according to resistance or voltage of a load circuit, when the switching circuit is switched to an ON state. Thereby, the heat transfer device of the present disclosure can control heat transfer, i.e., can emit heat, of the heat source from which the heat transfer device transfers heat.

Thus, when the switching circuit switches to the ON state or to the OFF state, the heat transfer device of the present disclosure can regulate heat transfer of the heat source, and enables a temperature control of the heat source.

BRIEF DESCRIPTION OF THE DRAWINGS

Objects, features, and advantages of the present disclosure will become more apparent from the following detailed description made with reference to the accompanying drawings, in which.

DETAILED DESCRIPTION (First Embodiment)

The first embodiment of the present disclosure is described with reference to the drawings in the following.

Figure 1:
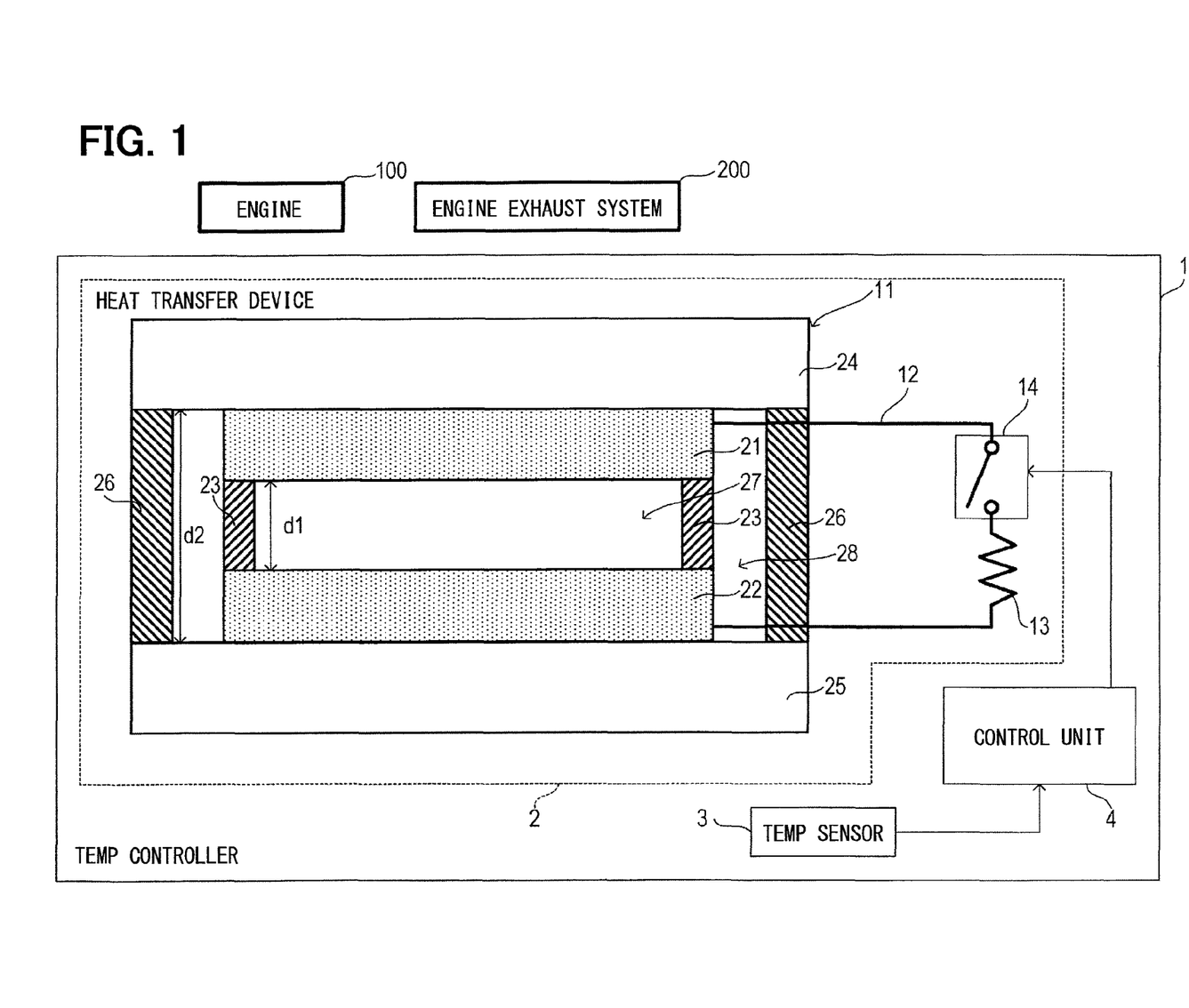
FIG. 1 is a diagrammatic configuration of a temperature controller in a first embodiment of the present disclosure.

As shown in FIG. 1, a temperature controller 1 of the present embodiment is installed in an engine exhaust system 200 which discharges the exhaust gas from an internal combustion engine 100 carried in a vehicle to the outside of the vehicle, and is provided with a heat transfer device 2, a temperature sensor 3, and a control unit 4.

The engine exhaust system 200 is provided with an exhaust pipe (not illustrated) which constitutes a passage of the exhaust gas discharged from the internal combustion engine 100, and a purifier (not illustrated) which purifies the exhaust gas passing through the exhaust pipe by using a catalyst.

The heat transfer device 2 is provided with a thermionic power generator 11, also known as a "thermoelectric power generation element," a wiring 12, a load resistor 13, and a switch 14.

The thermionic power generator 11 is provided with an emitter electrode 21, a collector electrode 22, an inner insulator 23, an emitter holder 24, a collector holder 25, and an outer insulator 26.

The emitter electrode 21 is an electrode for emitting the thermoelectron, and is formed in a plate-like shape made from tungsten in the present embodiment.

The collector electrode 22 is an electrode for capturing the thermoelectron emitted from the emitter electrode 21, and is formed in a plate-like shape made from tungsten (W) in the present embodiment.

The collector electrode 22 faces the emitter electrode 21 with an inter-electrode gap distance d1 of predetermined amount interposed therebetween.

The inner insulator 23 is arranged at a position between the emitter electrode 21 and the collector electrode 22, in order to keep an above-described state where the emitter electrode 21 and the collector electrode 22 are separate from each other with the inter-electrode gap distance d1.

The inner insulator 23 is formed in the shape of a hollow cylinder made from an aluminum oxide (i.e., $Al_2O_3$) in the present embodiment. The emitter electrode 21 covers an opening on one axial end side of the cylinder shaped inner insulator 23, and the collector electrode 22 covers the other opening on the other axial end side of the inner insulator 23. Thereby, an inner hollow part 27 surrounded by the emitter electrode 21, the collector electrode 22, and the inner insulator 23 is sealed. In the present embodiment, the gas of cesium (Cs) is air-tightly packed in the inner hollow part 27.

The emitter holder 24 is a component for holding the emitter electrode 21, and is formed in a plate-like shape made from chromium (Cr) in the present embodiment. The emitter holder 24 is attached to an opposite side of the emitter electrode 21 which is opposite to a collector facing side of the emitter electrode 21, for holding the emitter electrode 21.

Further, one side of the emitter holder 24, which is opposite to the emitter holding side described above, is attached to an outer periphery of the exhaust pipe at an upstream part relative to a catalyst of the engine exhaust system 200.

The collector holder 25 is a component for holding the collector electrode 22, and is formed in a plate-like shape made from iron (Fe) in the present embodiment. The collector holder 25 is attached to an opposite side of the collector electrode 22 which is opposite to an emitter facing side of the collector electrode 22, for holding the collector electrode 22.

The outer insulator 26 is arranged between the emitter holder 24 and the collector holder 25, in order to hold the emitter holder 24 and the collector holder 25 separate by an inter-component gap distance d2 of a preset amount. The outer insulator 26 is formed in a hollow cylinder shape made from an aluminum oxide ($Al_2O_3$) in the present embodiment. The emitter holder 24 covers an opening on one axial end side of the cylinder shaped outer insulator 26, and the collector holder 25 covers the other opening on the other axial end side of the outer insulator 26. Thereby, the emitter electrode 21 and the collector electrode 22 are arranged in an outer hollow part 28 that is surrounded by the emitter holder 24, the collector holder 25, and the outer insulator 26.

The wiring 12 electrically connects the emitter electrode 21 and the collector electrode 22.

The load resistor 13 is arranged on the electric current path between the emitter electrode 21 and the collector electrode 22 via the wiring 12 for the supply of the electric current, with one end connected to the emitter electrode 21 via the switch 14 and with the other end connected to the collector electrode 22.

The switch 14 is arranged on the electric current path between the emitter electrode 21 and the collector electrode 22 via the wiring 12 for the supply of the electric current, with one end connected to the emitter electrode 21 and with the other end connected to the load resistor 13.

Further, the switch 14 is driven to connect and to disconnect the electric current path between the emitter electrode 21 and the load resistor 13, i.e., switches between the ON state and the OFF state.

The temperature sensor 3 is attached near a catalyst of the engine exhaust system 200, and detects the temperature of the catalyst.

The control unit 4 is constituted as a microcomputer, which consists of CPU, ROM, RAM, I/O, and a bus line which connects these components, and performs various processing based on the program memorized in ROM.

The control unit 4 determines whether to switch the switch 14 to the ON state or to the OFF state based on a temperature detection value from the temperature sensor 3, and performs processing which outputs an ON instruction signal or an OFF instruction signal to the switch 14 based on such a determination result.

Specifically, the control unit 4 determines that the switch 14 should be switched to the OFF state, when it is determined based on the temperature detection value by the temperature sensor 3 that the temperature of the catalyst is less than an activation temperature (e.g., 300 degree Celsius). The control unit 4 determines that the switch 14 should be switched to the ON state, when it is determined based on the temperature detection value by the temperature sensor 3 that the temperature of the catalyst is higher than the activation temperature.

Figure 2:
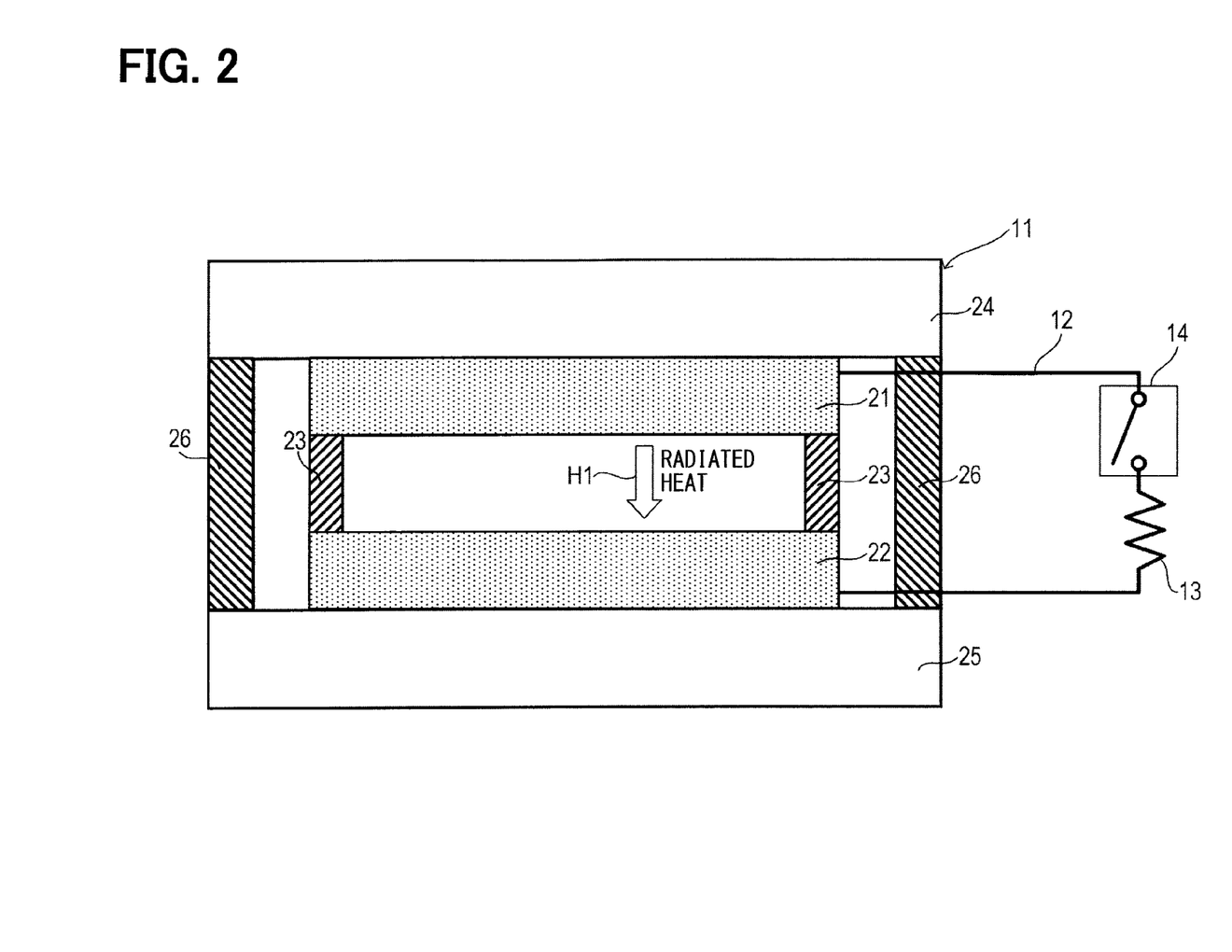
FIG. 2 is an illustration of a vacuum insulation state of a heat transfer device.

The switch 14 switches to the OFF state, when receiving an OFF instruction signal from the control unit 4. Thereby, heat is transferred from the emitter electrode 21 to the collector electrode 22 only by radiation (see an arrow H1 in FIG. 2), and the heat transfer device 2 is put in a vacuum insulation state.

The switch 14 switches to the ON state, when receiving an ON instruction signal from the control unit 4. Thereby, the thermoelectron moved from the emitter electrode 21 to the collector electrode 22 causes an electric current flowing in the load resistor 13 (see an arrow H2 and an electric current i1 in FIG. 3), and the heat transfer device 2 is put in a power generation state.

Figure 3:
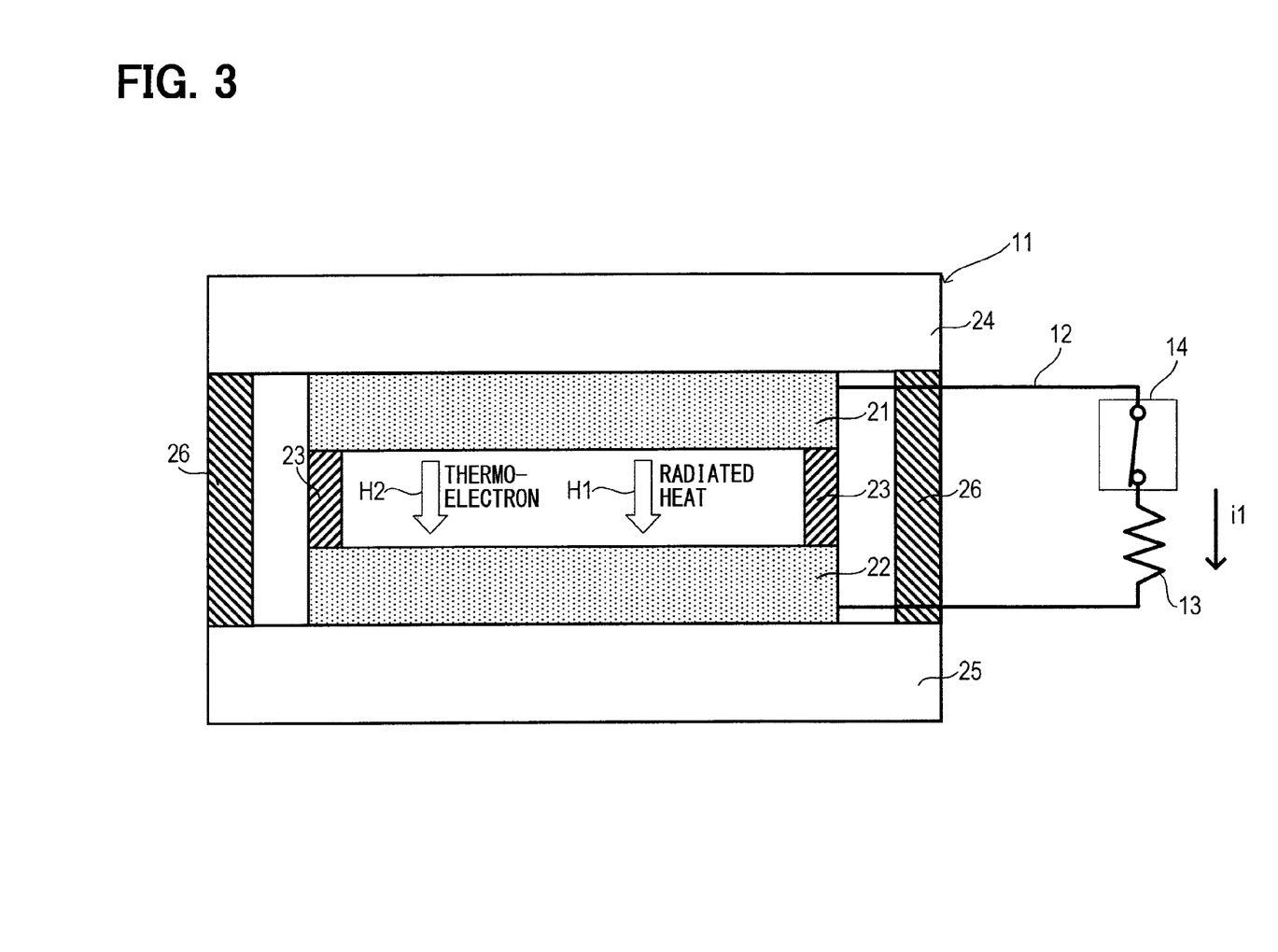
FIG. 3 is an illustration of a power generation state of the heat transfer device.

Further, the amount of the electronics cooling, for example, by the thermoelectron or thermion movement, is controllable by adjusting the resistance of the load resistor 13. More practically, when the emitter electrode 21 and the collector electrode 22 are short-circuited, the electronics cooling maximizes, and, as the resistance of the load resistor 13 increases, the electronics cooling decreases.

The heat transfer device 2 constituted in the above-described manner is provided with the thermionic power generator 11, the wiring 12, the load resistor 13, and the switch 14.

The thermionic power generator 11 is provided with the emitter electrode 21 and the collector electrode 22 that face each other with the inter-electrode gap distance d1, and converts heat energy to electric energy when the thermoelectron emitted from the emitter electrode 21 is captured by the collector electrode 22.

The wiring 12 electrically connects the emitter electrode 21 and the collector electrode 22. The load resistor 13 is connected to the electric current path via the wiring 12 through which the electric current flows between the emitter electrode 21 and the collector electrode 22.

The switch 14 switches to the ON state which allows a flow of the electric current in the electric current path and to the OFF state which intercepts a flow of the electric current in the electric current path.

Thus, when the switch 14 is switched to the OFF state, the heat transfer device 2 can restrict movement of the thermoelectron from the emitter electrode 21 to the collector electrode 22, and can achieve a vacuum insulation according to the degree of vacuum of the inner hollow part 27 which separates the emitter electrode 21 and the collector electrode 22. Thereby, the heat transfer device 2 can keep warmth of the catalyst of the engine exhaust system 200.

On the other hand, the heat transfer device 2 can move the thermoelectron from the emitter electrode 21 to the collector electrode 22 by an amount according to the resistance of the load resistor 13, when the switch 14 is switched to the ON state. Thereby, the heat transfer device 2 can emit heat from the catalyst of the engine exhaust system 200. Further, a power generation is enabled by the electric current flowing through the load resistor 13.

Thus, when the switch 14 switches to one of the two states, i.e., to the ON state and the OFF state, the heat transfer device 2 can control emission of heat from the catalyst of the engine exhaust system 200, and makes it possible to control the temperature of the catalyst of the engine exhaust system 200.

In the embodiment described above, the load resistor 13 is equivalent to a load circuit in the present disclosure, the switch 14 is equivalent to a switch circuit in the present disclosure, the control unit 4 is equivalent to a controller in the present disclosure, and the engine exhaust system 200 is equivalent to an exhaust system of an internal-combustion engine in the present disclosure.

(Second Embodiment)

The second embodiment of the present disclosure is described with reference to the drawings in the following. In the second embodiment, description focuses on a difference from the first embodiment.

Figure 4:
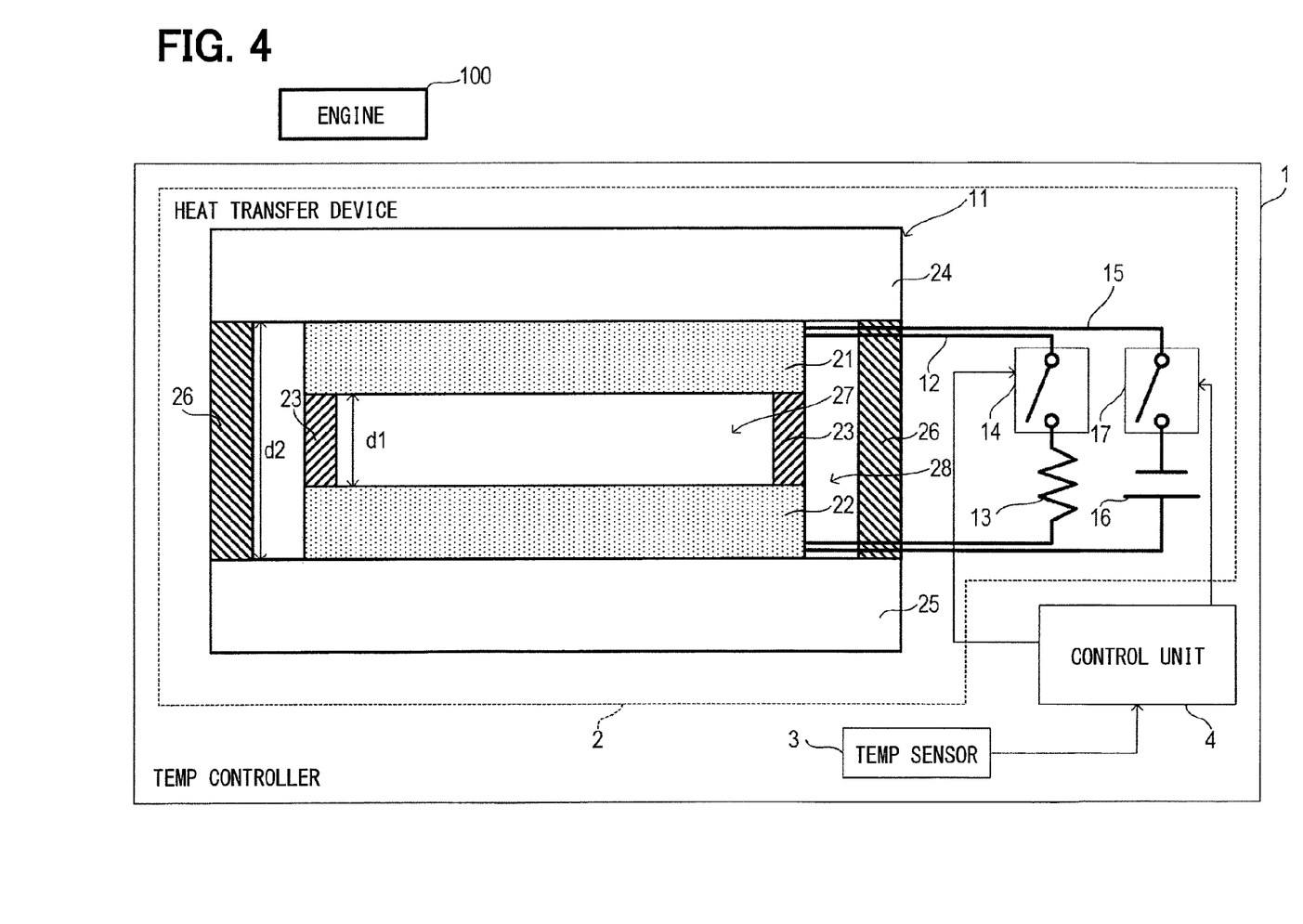
FIG. 4 is a diagrammatic configuration of the temperature controller in a second embodiment of the present disclosure.

As shown in FIG. 4, the temperature controller 1 of the present embodiment is installed in the internal combustion engine 100 carried in a vehicle, and is provided with the heat transfer device 2, the temperature sensor 3, and the control unit 4. The heat transfer device 2 is provided with the thermionic power generator 11, the wiring 12, the load resistor 13, the switch 14, an outer wiring 15, a power supply 16, and an outer switch 17.

The emitter holder 24 of the thermionic power generator 11 is attached to an outer wall of the combustion chamber of the engine in the vehicle.

The outer wiring 15 electrically connects the emitter electrode 21 and the collector electrode 22.

The power supply 16 is arranged on the electric current path between the emitter electrode 21 and the collector electrode 22 via the outer wiring 15 for the supply of the electric current, with the positive electrode connected to the collector electrode 22 and the negative electrode connected to the emitter electrode 21 via the outer switch 17.

The outer switch 17 is arranged on the electric current path between the emitter electrode 21 and the collector electrode 22 via the outer wiring 15 for the supply of the electric current, with one end connected to the emitter electrode 21 and the other end connected to the negative plate of the power supply 16. The outer switch 17 is driven to connect and disconnect the electric current path between the emitter electrode 21 and the power supply 16 for the supply of the electric power, i.e., switches between the ON state and the OFF state.

The temperature sensor 3 is attached to the outer wall of the above-mentioned combustion chamber, and detects the temperature of an engine outer wall.

The control unit 4 determines whether to switch the switch 14 and the outer switch 17 to the ON state or to the OFF state based on the temperature detection value by the temperature sensor 3, and performs processing which outputs an ON instruction signal or an OFF instruction signal to the switch 14 and the outer switch 17 based on the result of the above determination.

More practically, when the control unit 4 determines that it is necessary to raise the temperature of the engine outer wall based on the temperature detection value by the temperature sensor 3, the control unit 4 determines to switch the switch 14 and the outer switch 17 to the OFF state. Thereby, the control unit 4 outputs the OFF instruction signal to the outer switch 17 while outputting the OFF instruction signal to the switch 14.

When the control unit 4 determines that it is necessary to lower the temperature of the engine outer wall based on the temperature detection value by the temperature sensor 3, the control unit 4 determines to switch the switch 14 to the ON state and to switch the outer switch 17 to the OFF state. Thereby, the control unit 4 outputs the OFF instruction signal to the outer switch 17 while outputting the ON instruction signal to the switch 14.

When the control unit 4 determines that it is necessary to lower the temperature of the engine outer wall further based on the temperature detection value by the temperature sensor 3, the control unit 4 determines to switch the switch 14 to the OFF state and to switch the outer switch 17 to the ON state. Thereby, the control unit 4 outputs the ON instruction signal to the outer switch 17 while outputting the OFF instruction signal to the switch 14.

The switch 14 and the outer 17 respectively switch to the OFF state upon receiving an input of the OFF instruction signal from the control unit 4. Also, the switch 14 and the outer switch 17 respectively switch to the ON state upon receiving an input of the ON instruction signal from the control unit 4.

When the control unit 4 outputs the OFF instruction signal to the switch 14 and the outer switch 17, heat is transferred from the emitter electrode 21 to the collector electrode 22 only by radiation (see FIG. 2), and the heat transfer device 2 is put in a vacuum insulation state.

When the control unit 4 outputs the ON instruction signal to the switch 14 and outputs the OFF instruction signal to the outer switch 17, the thermoelectron moved from the emitter electrode 21 to the collector electrode 22 causes the electric current flowing in the load resistor 13 (see FIG. 3), and the heat transfer device 2 is put in a power generation state.

Figure 5:
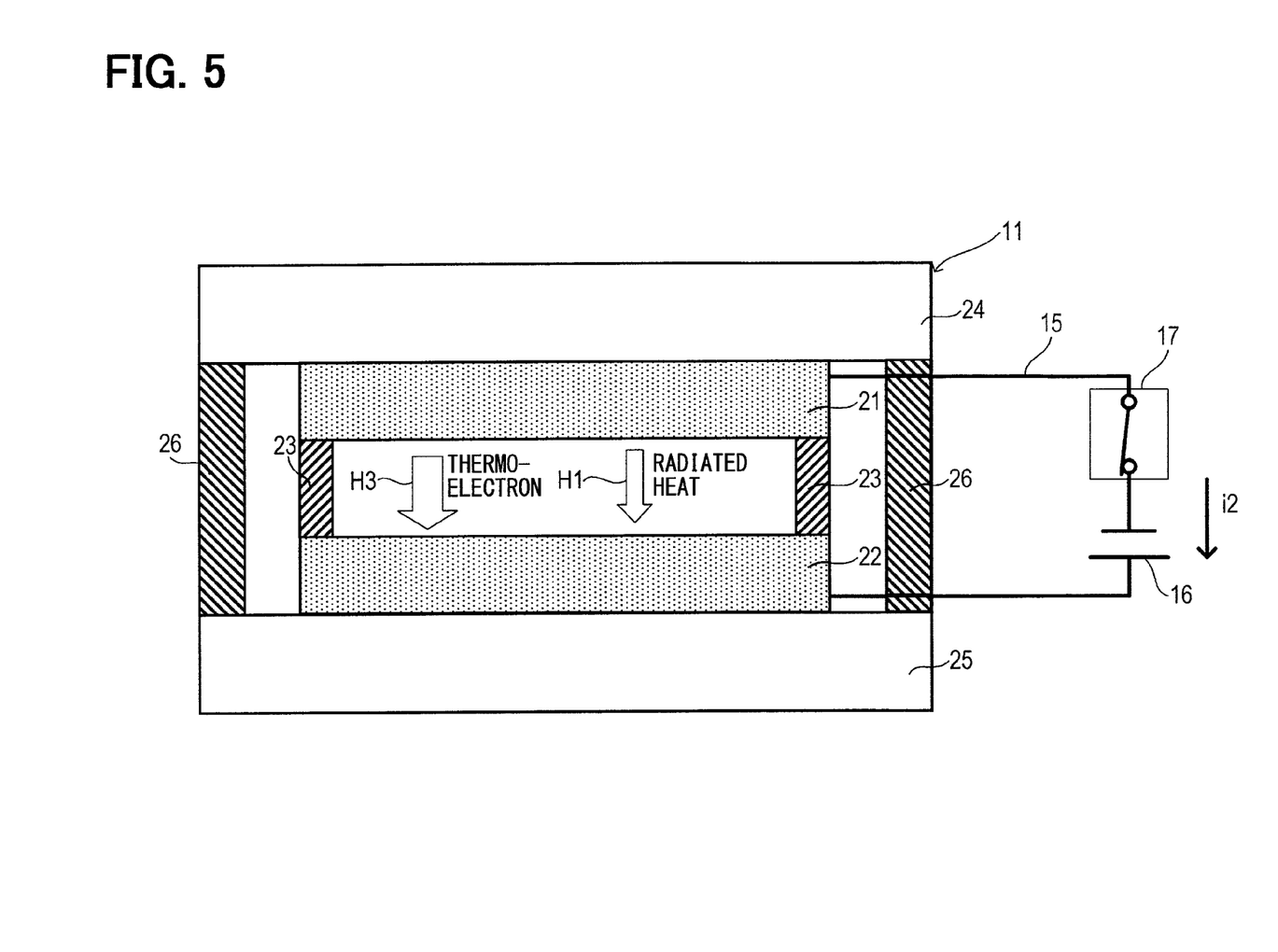
FIG. 5 is an illustration of a heat pump operation of the heat transfer device.

When the control unit 4 outputs the ON instruction signal to the outer switch 17 while the control unit 4 outputs the OFF instruction signal to the switch 14, the thermoelectron by an amount in proportion to the voltage of the power supply 16 moves from the emitter electrode 21 to the collector electrode 22, thereby causing the electric current to flow in the power supply 16 (see an arrow H3 and a current i2 in FIG. 5). Thereby, the heat transfer device 2 operates as a heat pump, and cools the engine outer wall. Further, by adjusting the voltage of the power supply 16, the amount of electronics cooling is controllable. More practically, the amount of electronics cooling increases as the voltage of the power supply 16 increases, and the amount of electronics cooling saturates when the voltage of the power supply 16 reaches a predetermined saturation voltage.

The heat transfer device 2 constituted in the above-described manner is provided with the thermionic power generator 11, the wiring 12, the load resistor 13, the switch 14, the outer wiring 15, the power supply 16, and the outer switch 17.

The wiring 12 provides the electric current path to which the load resistor 13 is connected. The outer wiring 15 provides the electric current path to which the power supply 16 is connected. Further, the wiring 12 and the outer wiring 15 are so configured that the power supply is independently provided for each of the wiring 12 and the outer wiring 15.

Further, the switch 14 and the outer switch 17 are independently switched to the ON state and to the OFF state on the electric current path of the wiring 12 and on the electric current path of the outer wiring 15, respectively.

Thus, when the switch 14 and the outer switch 17 switch to the OFF state, the heat transfer device 2 can restrict the movement of the thermoelectron from the emitter electrode 21 to the collector electrode 22, and can achieve a vacuum insulation according to the degree of vacuum of the inner hollow part 27 which separates the emitter electrode 21 and the collector electrode 22. Thereby, the heat transfer device 2 can keep warmth of the combustion chamber of the internal combustion engine 100 (i.e., can prevent heat from being emitted from the engine 100).

On the other hand, the heat transfer device 2 can move the thermoelectron from the emitter electrode 21 to the collector electrode 22 by an amount according to the resistance of the load resistor 13, when the switch 14 is switched to the ON state. Thereby, the heat transfer device 2 can emit heat from the combustion chamber of the internal combustion engine 100. Further, a power generation is enabled when the electric current flows in the load resistor 13.

Further, the heat transfer device 2 can move the thermoelectron from the emitter electrode 21 to the collector electrode 22 by an amount according to the voltage of the power supply 16, when the switch outer 17 is switched to the ON state. Thereby, the heat transfer device 2 can emit heat from the combustion chamber of the internal combustion engine 100.

Thus, when the switch 14 and the outer 17 switch to the ON state and to the OFF state, the heat transfer device 2 can control emission of the heat from the combustion chamber of the internal combustion engine 100, and enables the temperature control of the combustion chamber of the internal combustion engine 100.

In the embodiment described above, the load resistor 13 and the power supply 16 are equivalent to a load circuit in the present disclosure, and the switch 14 and the outer switch 17 are equivalent to a switch circuit in the present disclosure, and the wiring 12 is equivalent to a first wiring in the present disclosure, and the outer wiring 15 is equivalent to a second wiring in the present disclosure, and the engine 100 is equivalent to the an internal-combustion engine in the present disclosure.

(Third Embodiment)

The third embodiment of the present disclosure is described with the drawings in the following. In the third embodiment, description focuses on a difference from the second embodiment.

Figure 6:
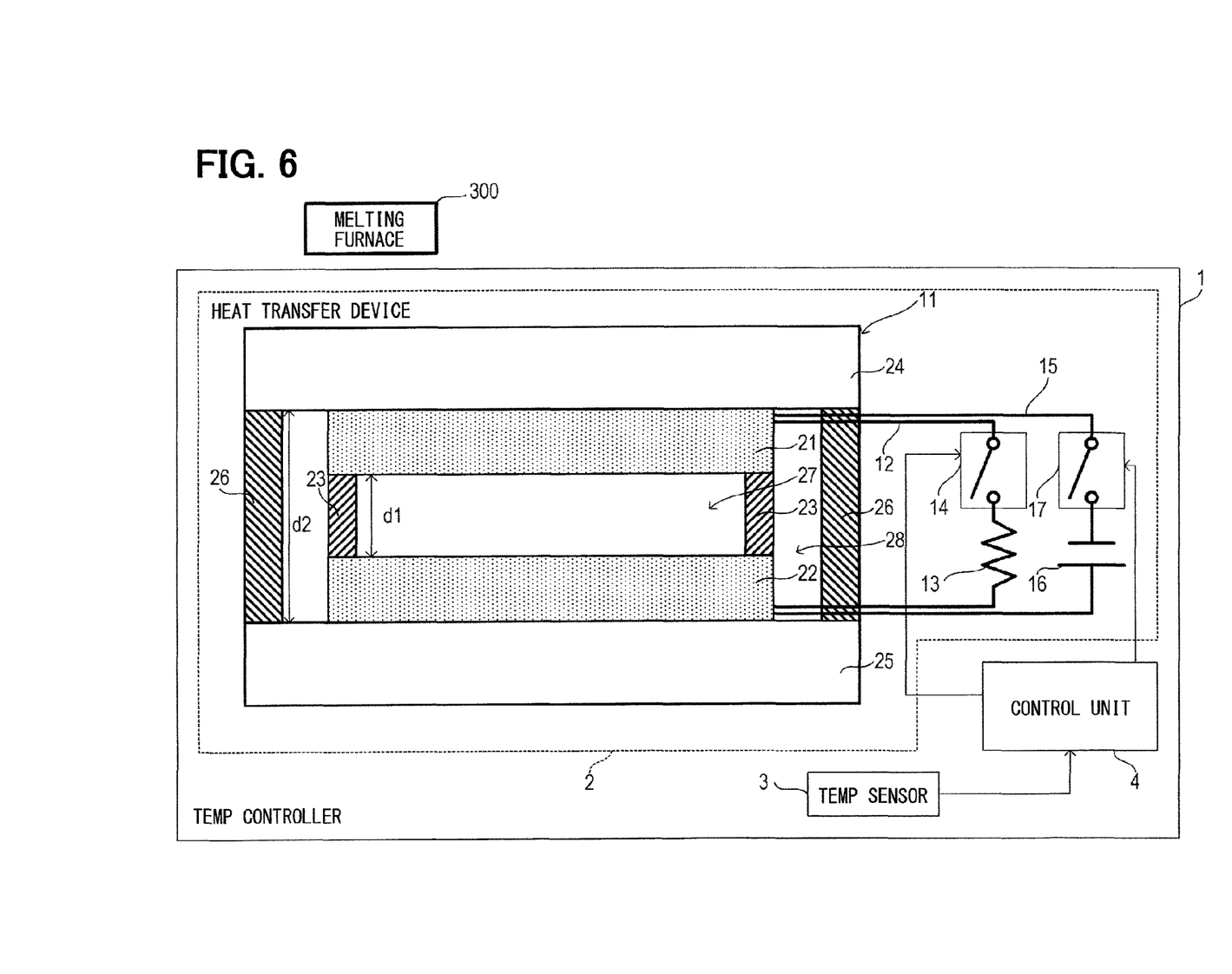
FIG. 6 is a diagrammatic configuration of the temperature controller in a third embodiment of the present disclosure.

As shown in FIG. 6, the temperature controller 1 of the present embodiment is installed in a melting furnace 300 (e.g., a metal melting furnace or a glass melting furnace), and is provided with the heat transfer device 2, the temperature sensor 3, and the control unit 4.

The heat transfer device 2 is provided with the thermionic power generator 11, the wiring 12, the load resistor 13, the switch 14, the outer wiring 15, the power supply 16, and the outer switch 17.

The emitter holder 24 of the thermionic power generator 11 is attached to the outer wall of the melting furnace 300.

The temperature sensor 3 is attached to the outer wall of the melting furnace 300, and detects the temperature of the melting furnace 300.

The control unit 4 determines whether to switch the switch 14 and the outer switch 17 to the ON state or to the OFF state based on the temperature detection value by the temperature sensor 3, and performs processing which outputs the ON instruction signal or the OFF instruction signal to the switches 14 and 17 based on the result of the above determination.

More practically, when the control unit 4 determines that it is necessary to raise the temperature of the melting furnace 300 to a preset temperature based on the temperature detection value by the temperature sensor 3, the control unit 4 determines to switch both of the switch 14 and the outer switch 17 to the OFF state. Thereby, the control unit 4 outputs the OFF instruction signal to the outer switch 17 while outputting the OFF instruction signal to the switch 14.

Further, when the control unit 4 determines that an excessive amount of heat is available to maintain the melting furnace 300 at the preset temperature, the control unit 14 determines to switch the switch 14 to the ON state and to switch the outer switch 17 to the OFF state. Thereby, the control unit 4 outputs the OFF instruction signal to the outer switch 17 while outputting the ON instruction signal to the switch 14.

Further, when the control unit 4 determines to maintain the melting furnace 300 at the preset temperature, the control unit 4 determines to switch the switch 14 to the OFF state and to switch the outer switch 17 to the ON state, or determines to switch the switch 14 to the ON state and to switch the outer switch 17 to the OFF state. Thereby, the control unit 4 outputs the OFF instruction signal to the switch 14 while outputting the ON instruction signal to the outer switch 17, or outputs the ON instruction signal to the switch 14 while outputting the OFF instruction signal to the outer switch 17.

The switch 14 and the outer switch 17 respectively switch to the OFF state upon receiving an input of the OFF instruction signal from the control unit 4. Also, the switch 14 and the outer switch 17 respectively switch to the ON state upon receiving an input of the ON instruction signal from the control unit 4.

When the control unit 4 outputs the OFF instruction signal to the switch 14 and the outer switch 17, heat is transferred from the emitter electrode 21 to the collector electrode 22 only by radiation (see FIG. 2), and the heat transfer device 2 is put in a vacuum insulation state. Thereby, heat transfer from the melting furnace 300 to the outside via the heat transfer device 2 is reduced to the minimum.

When the control unit 4 outputs the OFF instruction signal to the switch 14 while outputting the ON instruction signal to the outer switch 17, the electric current flows in the load resistor 13 due to the move of the thermoelectron which moved from the emitter electrode 21 to the collector electrode 22 (see FIG. 3), and the heat transfer device 2 is put in a power generation state. Thereby, the thermal energy released from the melting furnace 300 is transformed into the electrical energy, and is reused.

When the control unit 4 outputs the OFF instruction signal to the switch 14 while outputting the ON instruction signal to the switch outer 17, the electric current flows to the power supply 16 due to the move of the thermoelectron from the emitter electrode 21 to the collector electrode 22 by an amount proportional to the voltage of the power supply 16 (see an arrow H3 and an electric current i2 in FIG. 5). Thereby, the heat transfer device 2 operates as a heat pump, and cools the engine outer wall. Further, by adjusting the voltage of the power supply 16, the amount of electronics cooling is controllable. More practically, the amount of electronics cooling increases as the voltage of the power supply 16 increases, and the amount of electronics cooling saturates when the voltage of the power supply 16 reaches a predetermined saturation voltage.

Thus, when the switch 14 and the outer switch 17 switch to the OFF state, the heat transfer device 2 controls and restricts the movement of the thermoelectron from the emitter electrode 21 to the collector electrode 22, and enables a vacuum insulation according to the degree of vacuum of the inner hollow part 27 which separates the emitter electrode 21 and the collector electrode 22. Thereby, the heat transfer device 2 can maintain warmth of the melting furnace 300.

On the other hand, when the switch 14 is switched to the ON state, the heat transfer device 2 moves the thermoelectron from the emitter electrode 21 to the collector electrode 22 by an amount according to the resistance of the load resistor 13. Thereby, the heat transfer device 2 can emit heat from the melting furnace 300. Further, a power generation is enabled when the electric current flows in the load resistor 13.

Further, when the outer switch 17 is switched to the ON state, the heat transfer device 2 can move the thermoelectron from the emitter electrode 21 to the collector electrode 22 by an amount according to the voltage of the power supply 16. Thereby, the heat transfer device 2 can emit heat from the melting furnace 300.

Thus, when the switch 14 and the outer switch 17 switch to the ON state and to the OFF state, the heat transfer device 2 can control the emission of the heat from the melting furnace 300, and enables the temperature control of the melting furnace 300.

Although a few embodiments of the present disclosure is described in the above, the present disclosure is not limited to the above-mentioned embodiments, and, as long as it pertains to the technical scope of the present disclosure, the present disclosure may take various forms.

For example, although the emitter electrode 21 and the collector electrode 22 in the above are made from tungsten (W) in the above-mentioned embodiment, it is not limited to such material.

For example, at least one of the emitter electrode 21 and the collector electrode 22 may be made from the semiconductor material. By employing the semiconductor material, the amount of the thermoelectron emitted from the emitter electrode 21 and the collector electrode 22 may be adjusted according to the density of the dopant added by the semiconductor.

Further, the emitter electrode 21 and the collector electrode 22 may be made from the N type diamond to which the phosphorus (P) is added. The diamond is a material with negative electron affinity, and thus improves the power generation efficiency by the thermionic power generator 11 compared with metal. Further, by adding the phosphorus (P) to the diamond, the donor level is lowered to a level that is lower than a conduction band by about 0.6 eV.

Further, the density of the dopant added to the semiconductor that makes the emitter electrode 21 may be configured to be higher than the density of the dopant added to the semiconductor that makes the collector electrode 22. For example, the density of the phosphorus (P) added to the N type diamond which makes the emitter electrode 21 may preferably be configured to be higher than the density of the phosphorus (P) added to the N type diamond which makes the collector electrode 22. Further, the phosphorous density of the emitter electrode 21 may be controlled to $2\times10^{20}$ (/cm$^3$), and the phosphorous density of the collector electrode 22 may be controlled to $2\times10^{19}$ (/cm$^3$), for example. In such manner, the number of thermoelectrons emitted from the emitter electrode 21 is made to be larger than the number of the thermoelectrons emitted from the collector electrode 22, and the power generation efficiency by the thermionic power generator 11 is improved.

Further, the emitter electrode 21 and the collector electrode 22 may be made from the N type diamond to which the nitrogen (N) is added.

Further, the emitter electrode 21 is made from the N type diamond to which the nitrogen (N), and the collector electrode 22 may be made from the N type diamond to which the phosphorus (P) is added.

Further, the emitter electrode 21 may be made from the N type diamond to which the sulfur (S) is added, and the collector electrode 22 may be made from the N type diamond to which the antimony (Sb) is added. By adding the sulfur atom to the diamond, the donor level is lowered by about 0.4 eV than the conduction band.

Further, the emitter electrode 21 may be provided as a carbon film which has the boron nitride (BN) or the amorphous structure mainly made from the carbon atom, and the surface of the emitter electrode 21 may be made to have a terminal structure with the hydrogen atom. The boron nitride (BN) and the carbon film mentioned above are materials with the negative electron affinity, and thus improve the power generation efficiency compared with metal.

Further, by providing a termination structure with the hydrogen atom, stable negative electron affinity is obtained, thereby enabling a highly efficient thermoelectron emission for a long period of time.

The load resistor 13 serving as a load circuit in the first embodiment may be replaced with the power supply 16.

The constant resistance of the load resistor 13 in the first, second, and third embodiments may be changed to variable resistance, in which case, the amount of the thermoelectron emitted from the emitter electrode 21 may be controlled according to the variable resistance of the load resistor 13.

The constant voltage of the power supply 16 in the second and third embodiments may be changed to a variable voltage, in which case, the amount of the thermoelectron emitted from the emitter electrode 21 may be controlled according to the variable voltage of the power supply 16.

The function in one component in the above embodiment may be distributed to plural components, or the function realized by the plural components may be aggregated to only one component.

Further, a part of the configuration described above may be replaced with a well-known configuration in the art.

Further, a part of the configuration described above may be dispensed with.

Further, a part of the configuration described above may be added to the other embodiment, or replace in the other embodiment.

Further, all modes of technical thoughts described by the wording of the claims are considered as the embodiments of the present disclosure.

Such changes, modifications, and summarized schemes are to be understood as being within the scope of the present disclosure as defined by appended claims.

What is claimed is:

1. A heat transfer device comprising:
    a thermionic power generator having an emitter electrode and a collector electrode facing each other with a preset inter-electrode gap distance, and configured to convert heat energy into electric energy by capturing a thermoelectron emitted from the emitter electrode with the collector electrode;
    a wiring electrically connecting the emitter electrode and the collector electrode;
    a load circuit connected to an electric current path between the emitter electrode and the collector electrode via the wiring; and a switch circuit configured to switch between an ON state and an OFF state for conducting and blocking the electric current path, wherein the load circuit includes a resistor and a power supply having a positive electrode connected to the collector electrode, the wiring includes a first wiring serving as the electric current path to which the resistor is connected and a second wiring serving as the electric current path to which the power supply is connected, each of the first wiring and the second wiring for receiving an electric current independently, and the switch circuit switches the ON state and the OFF state of the electric current path independently for each of the first wiring and the second wiring.

2. The heat transfer device of claim 1, wherein the load circuit includes a resistor.

3. The heat transfer device of claim 1, wherein the load circuit includes a power supply having a positive electrode connected to the collector electrode.

4. The heat transfer device of claim 1, wherein at least one of the emitter electrode and the collector electrode is made from a semiconductor material.

5. The heat transfer device of claim 4, wherein the semiconductor material comprises a diamond.

6. The heat transfer device of claim 4, wherein the emitter electrode and the collector electrode are made from a semiconductor material, and a dopant density of the semiconductor material that forms the emitter electrode is higher than a dopant density of the semiconductor material that forms the collector electrode.

7. A temperature controller comprising:
a heat transfer device, the heat transfer device comprising:
   a thermionic power generator having an emitter electrode and a collector electrode facing each other with a preset inter-electrode gap distance, and configured to convert heat energy into electric energy by capturing a thermoelectron emitted from the emitter electrode with the collector electrode;
   a wiring electrically connecting the emitter electrode and the collector electrode;
   a load circuit connected to an electric current path between the emitter electrode and the collector electrode via the wiring; and
   a switch circuit configured to switch between an ON state and an OFF state for conducting and blocking the electric current path; and
a control device controlling the switch circuit,
wherein
the load circuit includes a resistor and a power supply having a positive electrode connected to the collector electrode,
the wiring includes a first wiring serving as the electric current path to which the resistor is connected and a second wiring serving as the electric current path to which the power supply is connected, each of the first wiring and the second wiring for receiving an electric current independently, and
the switch circuit switches the ON state and the OFF state of the electric current path independently for each of the first wiring and the second wiring.

8. An internal combustion engine comprising:
a temperature controller, the temperature controller comprising:
   a heat transfer device, the heat transfer device comprising:
      a thermionic power generator having an emitter electrode and a collector electrode facing each other with a preset inter-electrode gap distance, and configured to convert heat energy into electric energy by capturing a thermoelectron emitted from the emitter electrode with the collector electrode;
      a wiring electrically connecting the emitter electrode and the collector electrode;
      a load circuit connected to an electric current path between the emitter electrode and the collector electrode via the wiring; and
      a switch circuit configured to switch between an ON state and an OFF state for conducting and blocking the electric current path; and
   a control device controlling the switch circuit,
wherein
the load circuit includes a resistor and a power supply having a positive electrode connected to the collector electrode,
the wiring includes a first wiring serving as the electric current path to which the resistor is connected and a second wiring serving as the electric current path to which the power supply is connected, each of the first wiring and the second wiring for receiving an electric current independently, and
the switch circuit switches the ON state and the OFF state of the electric current path independently for each of the first wiring and the second wiring.

9. An exhaust system of an internal combustion engine comprising:
a temperature controller, the temperature controller comprising:
   a heat transfer device, the heat transfer device comprising:
      a thermionic power generator having an emitter electrode and a collector electrode facing each other with a preset inter-electrode gap distance, and configured to convert heat energy into electric energy by capturing a thermoelectron emitted from the emitter electrode with the collector electrode;
      a wiring electrically connecting the emitter electrode and the collector electrode;
      a load circuit connected to an electric current path between the emitter electrode and the collector electrode via the wiring; and
      a switch circuit configured to switch between an ON state and an OFF state for conducting and blocking the electric current path; and
   a control device controlling the switch circuit,
wherein
the load circuit includes a resistor and a power supply having a positive electrode connected to the collector electrode,
the wiring includes a first wiring serving as the electric current path to which the resistor is connected and a second wiring serving as the electric current path to which the power supply is connected, each of the first wiring and the second wiring for receiving an electric current independently, and
the switch circuit switches the ON state and the OFF state of the electric current path independently for each of the first wiring and the second wiring.

10. A melting furnace comprising:
a temperature controller, the temperature controller comprising:
a heat transfer device, the heat transfer device comprising:
a thermionic power generator having an emitter electrode and a collector electrode facing each other with a preset inter-electrode gap distance, and configured to convert heat energy into electric energy by capturing a thermoelectron emitted from the emitter electrode with the collector electrode;
a wiring electrically connecting the emitter electrode and the collector electrode;
a load circuit connected to an electric current path between the emitter electrode and the collector electrode via the wiring; and
a switch circuit configured to switch between an ON state and an OFF state for conducting and blocking the electric current path; and
a control device controlling the switch circuit,
wherein
the load circuit includes a resistor and a power supply having a positive electrode connected to the collector electrode,
the wiring includes a first wiring serving as the electric current path to which the resistor is connected and a second wiring serving as the electric current path to which the power supply is connected, each of the first wiring and the second wiring for receiving an electric current independently, and
the switch circuit switches the ON state and the OFF state of the electric current path independently for each of the first wiring and the second wiring.

* * * * *